(12) United States Patent
Jones et al.

(10) Patent No.: US 6,674,373 B1
(45) Date of Patent: Jan. 6, 2004

(54) SYSTEM AND METHOD FOR DATA DECOMPRESSION

(75) Inventors: Larry D. Jones, Louisville, CO (US); Doug Solfermoser, Arvada, CO (US)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 10/188,904

(22) Filed: Jul. 3, 2002

(51) Int. Cl.[7] .............................................. H03M 7/38
(52) U.S. Cl. ............................ 341/51; 341/55; 341/50; 341/161
(58) Field of Search ........................... 341/51, 161, 50, 341/87, 55; 708/210; 711/108; 710/68

(56) References Cited

U.S. PATENT DOCUMENTS

| | | | | |
|---|---|---|---|---|
| 5,155,484 A | * | 10/1992 | Chambers, IV | 341/55 |
| 5,184,126 A | * | 2/1993 | Nagy | 341/67 |
| 5,247,638 A | | 9/1993 | O'Brien et al. | |
| 5,374,916 A | * | 12/1994 | Chu | 340/146.2 |
| 5,467,087 A | * | 11/1995 | Chu | 341/51 |
| 5,602,764 A | | 2/1997 | Eskandari-Gharnin | |

* cited by examiner

Primary Examiner—Jean Bruner Jean Glaude
(74) Attorney, Agent, or Firm—Brooks Kushman P.C.

(57) ABSTRACT

A system and method for decompressing data read from a storage medium include a multiple stage pipeline process for substantially simultaneously processing at least two bytes of data in parallel. The process includes a first stage for receiving literal reference data and history reference data converted from history references to corresponding addresses, and directing data to subsequent stages. A second stage in communication with the first stage has multiple parallel buffers for selectively storing data and/or addresses provided from the first stage. A third stage in communication with the first and second stages has parallel literal buffers and parallel history buffers for selectively storing literal references and a predetermined number of bytes of previously processed uncompressed data, respectively. A fourth stage in communication with the third stage stores uncompressed data and provides the uncompressed data to an output channel in addition to updating the history buffers.

19 Claims, 2 Drawing Sheets

SYSTEM AND METHOD FOR DATA DECOMPRESSION

BACKGROUND OF THE INVENTION

1. Field of the Invention

The present invention relates to a system and method for decompressing a compressed data stream to reconstruct the original uncompressed data.

2. Background Art

Data compression technology is used to increase the virtual capacity of many types of storage devices. In general, data is compressed as it is written to a storage device from a host processor. The data is then decompressed as the host processor subsequently reads the data back from the storage device. Depending upon the particular application, various types of compression algorithms may be used to provide a significant compression ratio. However, the compression/decompression algorithm often presents a bottleneck to the data transfer rates that these types of storage devices can otherwise achieve.

In one existing approach to data compression and decompression, compressed data is represented as a series of literal references or as history references. Literal references are single bytes of data and are encoded as nine-bit values. History references are encoded in varying lengths and replace the data which they are referencing. A history reference provides an address and a count to an identical string of data that is located in a history buffer, which contains up to 1024 bytes, for example, of the most recent data that has already passed by in the data stream.

During decompression, history references are processed to generate corresponding addresses within the history buffer. These addresses are used to provide the corresponding data from the history buffer. The data obtained from the history buffer is combined in the appropriate sequence with the literal data references to reconstruct the original data stream.

When reading a data stream from a data storage device, compressed data can be transferred at a high effective rate. One prior art approach outputs a single byte of decompressed data each clock cycle. This approach results in a relatively low data transfer rate of decompressed data to the host processor channel. Advancements in technology allow the decompression function to run at about 50 MHz (for FPGA implementations) or 100 MHz (for ASIC implementations) which can provide channel transfer rates of 50 MB/s to 100 MB/s, respectively. However, current interfaces (such as Fibre Channel interfaces) can reach speeds of 200 MB/s or more. As such, the prior art approach for decompressing the data is not able to keep up with the maximum speed of currently available host processor interfaces.

SUMMARY OF THE INVENTION

The present invention provides a method and system for reconstructing data from a compressed data stream. The present invention provides a parallel data decompression approach that uses a multiple stage pipeline process to extract two or more references from the compressed data stream. The extracted literal and history references are converted to individual bytes of data or history buffer addresses and are pipelined in parallel toward the history buffer. The history buffer is replicated for each byte of data to allow substantially simultaneous accesses to two different locations. An output stage determines whether the literal bytes or the data bytes that have been read from one or the other of the history buffers will be output to the channel. The parallel data decompression system and method according to the present invention can continue to output multiple bytes of data as long as compressed data continues to be available from the storage device.

The modular design of the present invention allows multiple bytes of compressed data to be extracted, e.g. during each clock cycle. This design may be expanded to include "n" bytes of data in parallel with additional history buffers added corresponding in the number to the "n" bytes of data. Because of the nature of how history and literal references are extracted from the compressed data stream, stages of the pipeline may tend to go partially empty. This results in an inability to sustain an output of multiple bytes per clock cycle. As such, the present invention includes control logic that can generate multiple history buffer addresses from one history reference, to refill multiple stages of the pipeline in an attempt to keep the pipeline full. The invention also includes control logic to synchronize the history buffers by writing identical data to each of the history buffers substantially simultaneously, e.g. during the same clock cycle. Because multiple bytes of data can be accessed from the history buffers, the present invention also includes logic to resolve history buffer access contention.

In one embodiment according to the present invention, the system and method include extracting literal reference or history reference data from the compressed data stream, converting history reference data to a plurality of corresponding addresses that may be used to selectively access substantially simultaneously at least two history reference memories to retrieve previously stored uncompressed data associated with the history reference data via the corresponding addresses, and substantially simultaneously providing at least two bytes of uncompressed data to corresponding output registers, wherein the at least two bytes of uncompressed data are reconstructed from the literal data, the history reference memories, or both.

The present invention provides a number of advantages relative to the prior art. For example, the present invention provides the ability to substantially increase the rate at which compressed data can be read from a storage device. In fact, the effective rate of transfer of the decompressed data can be multiplied up to "n" times faster, where "n" represents the number of history buffers that are incorporated. This can be accomplished using available technology without sacrificing backward compatibility. As such, the present invention allows the decompression logic to read data at the same rate as the industry's current standard channel rates, and provides an architecture that can be extended to meet future demands. In that regard, it should be noted that the increased speed provided by the present invention is achieved regardless of the technology used for decompression or interface functions.

The above advantages, and other advantages, objects, and features of the present invention are readily apparent from the following detailed description of the best mode for carrying out the invention when taken in connection with the accompanying drawings.

DETAILED DESCRIPTION OF THE PREFERRED EMBODIMENT(S)

Figure 1:
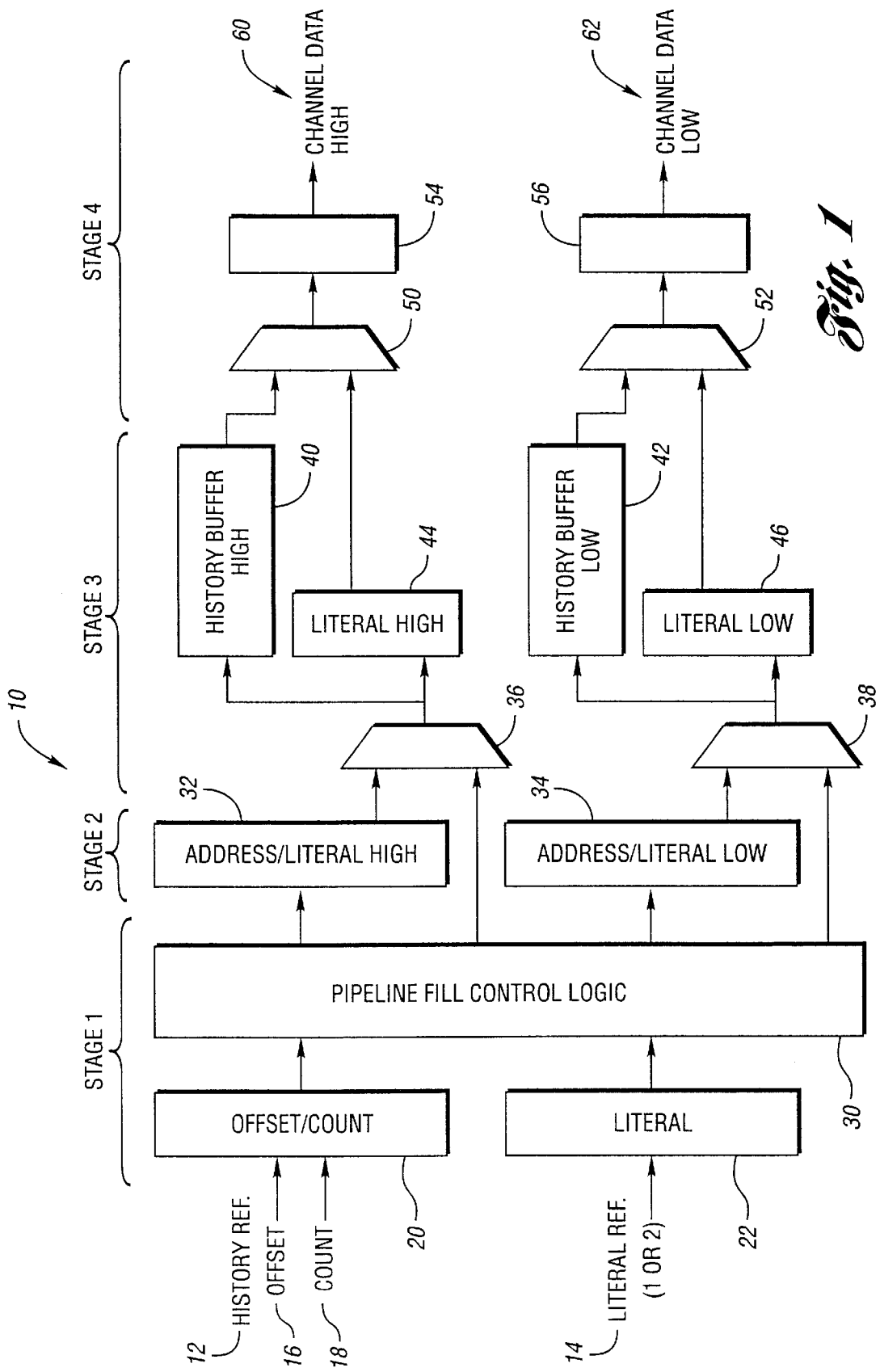
FIG. 1 is a block diagram illustrating one embodiment of a system or method for reconstructing data from a compressed data stream according to the present invention.

Referring to the Figures, the preferred embodiment(s) of the present invention will now be described. FIG. 1 is a block diagram representing one embodiment of a system or method for reconstructing compressed data according to the present invention. In this embodiment, system or method 10 is represented as a multiple stage pipelined process. Compressed data, which may be read from a tape storage device, for example, is extracted from a disassembler. The disassembler extracts literal references or a history reference from the compressed data stream read from the storage device, or other device. These references are applied to a multiple stage pipeline, referred to as the history buffer function, which is capable of outputting two or more bytes of decompressed data, e.g. during each clock cycle. For ease of illustration and description only, the representative block diagram of FIG. 1 illustrates use of the present invention in a system or method for decompressing data which processes two bytes of data during each clock cycle. Of course, one of ordinary skill in the art will recognize that the modular architecture of the present invention may be expanded to process more than two bytes of data in parallel substantially simultaneously. As such, depending upon the particular implementation, more than two bytes of data may be extracted and processed through the various stages, e.g. during each clock cycle.

The disassembler parses the compressed data stream and identifies the bytes of data as literal data or history reference data. As described above, literal references are single bytes of data. In one embodiment, literal references are encoded as nine-bit values. History references are encoded in varying lengths and are used to replace the data that they are referencing. History references provide an address and a count to an identical string of data that is located in a history buffer that contains a predetermined number of the most recent data that has already passed by in the uncompressed data stream. Each history reference is converted to two or more corresponding addresses to access the history buffer and expand the history reference data into the original uncompressed data. In a preferred embodiment, each history buffer contains 1 kB of the most recent data and is updated each clock cycle as data is presented to the output.

Either the extracted history reference data 12 or literal reference data 14 are provided to the history buffer function or process illustrated in FIG. 1 via an appropriate bus having control and data lines (not specifically illustrated). In one embodiment, the bus includes two signal lines to indicate whether the received data correspond to a single literal reference, multiple literal references, or a history reference. History reference data 12 include an offset 16 and count 18 which are loaded into a corresponding register 20. Offset 16 represents the address of the last byte of the matching string while count 18 represents the actual matched string length. These values are used to generate one or more addresses for accessing the history buffer(s) as described in greater detail below.

Data from the disassembler is advanced into stage 1 if the corresponding control signals indicate that the data is valid and the history buffer has not asserted a wait signal to the disassembler. The offset/count register 20 and the literal register 22 within stage one capture the control signals as well as the corresponding values of the offset 16 and count 18 for history references, or the literal values 14 of literal references. If the sequence of addresses generated from a previous history reference has been completely advanced to stage two or stage three by the pipeline fill control logic 30, and only one final address would remain at stage one, that final address is registered separately as the "last address" in order to allow new references to be received from the disassembler. This "last address" will be the next value to be advanced into the subsequent stages of the pipeline.

If stage one registers literal data, those data are subsequently moved to stage two or directly to stage three as determined by pipeline fill control logic 30 to assist in keeping all stages full of data. Pipeline fill control logic 30 converts history reference data to a plurality of corresponding addresses that may be used to substantially simultaneously access at least two history reference buffers or memories to retrieve previously stored uncompressed data associated with the history reference data via the corresponding addresses. Pipeline fill control logic 30 generates an incrementing sequence of addresses with which to access the referenced matched uncompressed string from the corresponding history buffer or memory. These addresses are subsequently moved to corresponding registers 32 and 34 of stage two, and/or moved directly to stage three registers 40 and 42 if necessary to keep the pipeline full of data. A wait state is generated and an appropriate signal is provided to the disassembler until the entire sequence of addresses can be sent to the subsequent stages of the pipeline.

As also illustrated in FIG. 1, stage two receives and holds literal data or history buffer addresses from stage one. Data is advanced into stage two if data from stage one has valid information and a downstream wait signal from the history buffers is not active. Stage two is wide enough to hold each of the parallel bytes of data, the number of which depends upon the particular implementation. In the representative embodiment illustrated in FIG. 1, stage two is wide enough to hold a high-order data/address and a low-order data/address value in corresponding registers 32 and 34. A state machine indicates the type of information contained at stage two of the pipeline. Each half of the stage may contain literal data, a history buffer address, or be empty. The state machine also uses information from stage one as well as its own state to determine what to load into stage two and stage three. As described above, data from stage one can bypass stage two and be loaded directly into stage three via corresponding multiplexers 36 and 38 if stage two is currently empty. In the preferred embodiment, the state machine can take up to four addresses from a history reference, or up to two literal data bytes per clock cycle in an effort to keep the pipeline full.

Stage three is in communication with both stage one and stage two via multiplexers 36 and 38. Stage three receives and holds literal data or history buffer addresses from stage two or stage one. Data is advanced into stage three if the state machine indicates that data is available and the wait signal from the history buffers is not active. There are separate registers to hold literal data, if present. Addresses at this stage are registered inside the memories that implement the history buffers. A second simpler state machine indicates what type of information is contained at stage three of the pipeline. Each half of the stage may contain literal data, a history buffer address, or be empty. Stage three always contains some combination of literal data and history buffer addresses, or it is completely empty.

A separate history buffer or memory is used for each half of stage three of the pipeline. The history buffers are represented in FIG. 1 by history buffer high 40 and history buffer low 42. In one preferred embodiment, each history buffer 40, 42 is implemented using a dual port synchronous SRAM (512×16). Stage three also includes registers 44 and 46 for storing literal data represented as literal high and literal low, respectively. As illustrated, the address registers associated with history buffers 40 and 42 are at the same level in the pipeline as data registers 44 and 46. All of the history buffers 40, 42 are updated with the same bytes of data that are written to the output registers 54, 56 in stage four. The write address for the history buffers is then incremented following each write to the memories. This keeps identical information in all history reference memories at all times. The use of an individual history buffer for each byte of data allows independent access by each path through the pipeline. This feature of the invention is particularly useful when processing a high-order byte containing the last address for one history reference and a low-order byte containing the first address for a subsequent history reference, for example.

Stage four receives and holds data received from stage three via multiplexers 50 and 52. Data is advanced into stage four if there is valid information at stage three and any downstream wait signal is not active. Stage four holds both high-order and low-order values of uncompressed data in corresponding registers 54 and 56, respectively. Multiplexers 50 and 52 are used to determine the exact source of the data. As illustrated, the high-order and low-order halves of the pipeline independently determine their own data source. Each byte of data typically comes either from literal data received from the disassembler or from; data read from the history buffer. In one preferred implementation, the least significant bit of the stage three addresses selects whether data from bits 15:8 or from bits 7:0 of the history buffer RAM will be latched. Because two or more bytes of data can effectively be accessed from the history buffers each cycle, data that needs to be loaded into stage four of the pipeline may instead need to be sourced from one or the other of the output stage registers rather than from the history buffers themselves. This can happen when the history buffer location which would otherwise be accessed has not had a chance to be updated due to the latency associated with writing to the history buffer. The uncompressed data stored in registers 54 and 56 are output one half word at a time as channel data high 60 and channel data low 62, respectively.

Figure 2:
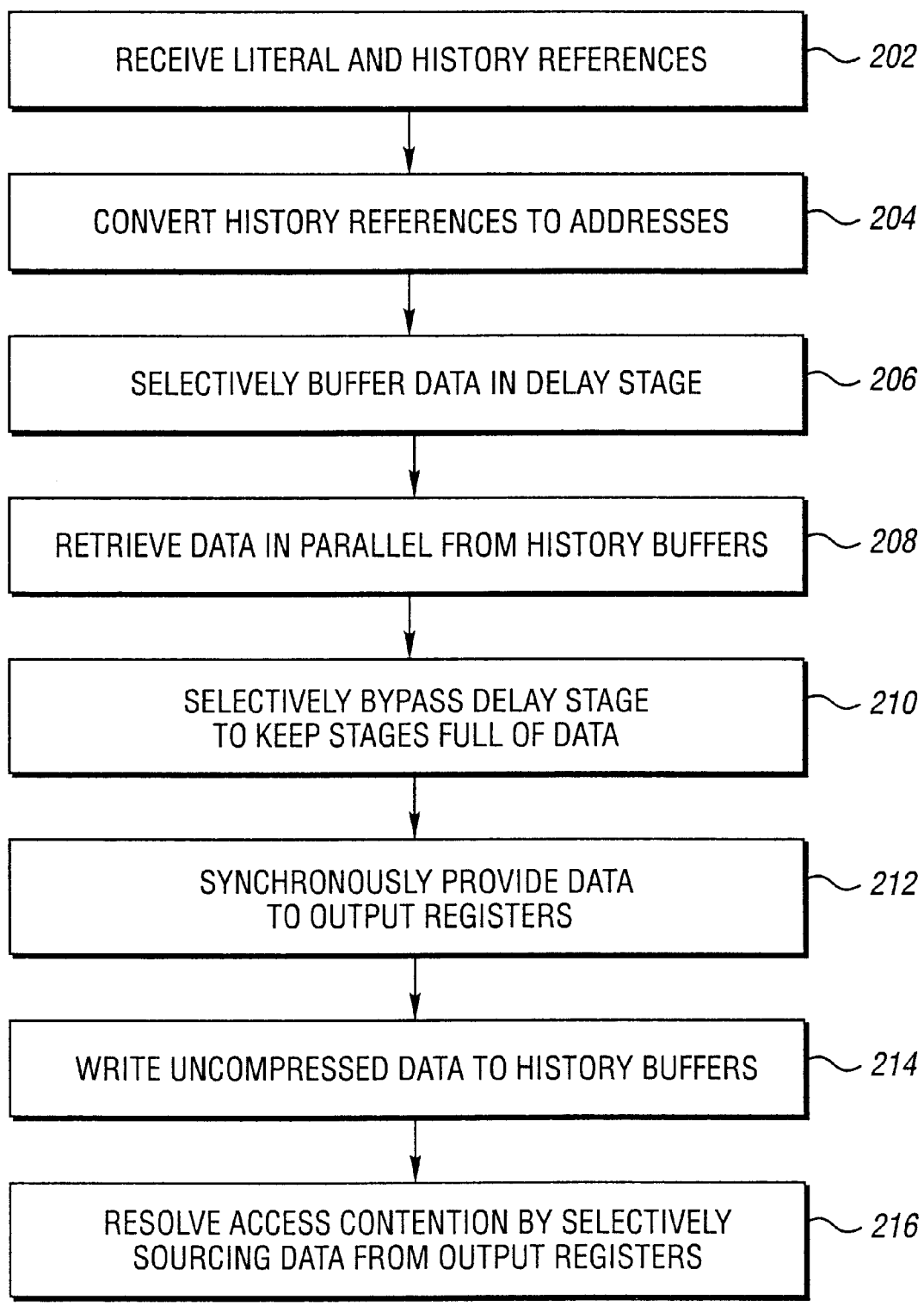
FIG. 2 is a flowchart illustrating operation of one embodiment of a system or method for decompressing data read from a storage medium according to the present invention.

A flowchart providing an alternative representation of operation of a system or method for reconstructing data from a compressed datastream according to one embodiment of the present invention is shown in FIG. 2. As will be appreciated by one of ordinary skill in the art, the flowchart in FIG. 2 represents control logic which may be implemented in software, hardware, or a combination of software and hardware depending upon the particular application. As will also be appreciated by those of skill in the art, the control logic illustrated may be implemented using any of a number of known programming and processing techniques or strategies and is not limited to the particular order or sequence illustrated in the figures. In keeping with the present invention, various functions illustrated as sequential processes may be performed in parallel, i.e. substantially simultaneously, preferably during a single clock cycle.

In one embodiment, the compressed datastream is sourced by a storage device, such as a tape storage device, during read back. The compressed data preferably includes literal references and history references as described in greater detail above. In a preferred embodiment, literal references or a history reference is extracted and provided to subsequent stages of a pipeline process as represented by block 202. In one embodiment, literal reference data are encoded as nine-bit values while history references are encoded in varying lengths and replace the data which they are referencing. Literal references may be passed without conversion to the subsequent stages of the pipeline while history references are converted to a plurality of corresponding addresses as represented by block 204.

Because of the nature of how history and literal references are extracted from the compressed datastream, various stages of the pipeline leading to the history buffer may tend to go partially empty. As such, a pipeline fill control algorithm or control logic is provided to keep the history buffer pipeline full in an attempt to sustain a consistent output of multiple bytes, preferably per clock cycle. One or more delay stages may be provided to selectively buffer and synchronize the data through the pipeline as represented by block 206. The plurality of addresses may be used to substantially simultaneously, e.g. during a single clock cycle, access at least two history reference memories to retrieve previously stored uncompressed data associated with the history reference data and stored in the corresponding addresses as represented by block 208.

Depending upon the number of parallel bytes of data, and the number of stages in the pipeline process, additional delay stages may be used in an attempt to continuously provide multiple bytes of data in parallel at the output. One or more delay stages may be selectively bypassed by advancing data directly from a current stage to a subsequent stage. At the same time, the delay stages may also be filled with available addresses to assist in keeping al stages full as represented by block 210. The method may also include substantially simultaneously (and preferably synchronously) providing at least two bytes of uncompressed data to corresponding output registers as represented by block 212. The multiple bytes of uncompressed data are reconstructed from the literal data, the history reference memories, or both.

As represented by block 214, a system and method according to the present invention may also include substantially simultaneously (and preferably synchronously) writing the at least two bytes of uncompressed data into each of the history reference memories so that all history reference memories contain identical data. As multiple bytes of data can effectively be accessed from the history buffers substantially simultaneously, e.g. during each clock cycle, a history buffer access contention strategy is provided. The access contention logic determines when data that needs to be loaded into the pipeline's output stage is sourced from the output stage registers rather than from the history buffers themselves. This situation may occur when the history buffer location that would otherwise be accessed has not had a chance to be updated due to the latency associated with writing to the history buffer. As such, block 216 includes selectively providing data from an output of at least one of the output registers to an input of the output register when an address generated by the history reference data is the same address selected for writing the uncompressed data to update the history buffers.

As such, the present invention provides a decompression algorithm or architecture that can process multiple bytes of data substantially simultaneously, e.g. during each clock cycle. This provides a relatively higher transfer rate of the compressed data to the host processor channel to attain data rates consistent with current technology. The system and method of the present invention can output multiple bytes of data substantially simultaneously, e.g. per clock cycle on nearly every cycle, as long as compressed data continues to be available with the actual rate depending upon the specific data pattern and implementation of the invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for reconstructing data using literal references or a history reference from a compressed data stream, the method comprising:

converting history reference data to a plurality of corresponding addresses that is used to selectively access substantially simultaneously at least two history reference memories to retrieve previously stored uncompressed data associated with the history reference data via the corresponding addresses; and substantially simultaneously providing at least two bytes of uncompressed data, wherein the at least two bytes of uncompressed data are reconstructed from literal reference data, the history reference memories, or both.

2. The method of claim 1 further comprising:

substantially simultaneously writing the at least two bytes of uncompressed data into each of the history reference memories so that all history reference memories contain identical data.

3. The method of claim 2 wherein the at least two bytes of uncompressed data are provided to corresponding output registers, the method further comprising:

selectively providing data from an output of at least one of the output registers to an input of the at least one output register when an address generated by the history reference data is the same address selected for writing the uncompressed data.

4. The method of claim 1 wherein the steps of converting and substantially simultaneously providing correspond to stages of a multiple stage pipelined process.

5. The method of claim 4 further comprising:

selectively buffering data in a delay stage after the stage of converting; and selectively bypassing the delay stage by advancing data directly from the converting stage to a subsequent stage to assist in keeping all stages full of data.

6. The method of claim 5 wherein the step of selectively bypassing comprises advancing literal reference data directly to a buffer within the subsequent stage.

7. The method of claim 5 wherein the step of selectively bypassing comprises advancing addresses to the subsequent stage to access at least one of the history reference memories to retrieve previously stored uncompressed data associated with the history reference data.

8. The method of claim 5 wherein the step of selectively bypassing comprises advancing addresses to the subsequent stage to substantially simultaneously access the history reference memories to retrieve previously stored uncompressed data associated with the history reference data.

9. The method of claim 1 wherein the step of converting includes converting the history reference data to a plurality of sequential addresses running the length of the history reference data.

10. The method of claim 9 wherein a last one of the sequential addresses is combined with an address generated from a subsequently extracted history reference within a single clock cycle.

11. A system for reconstructing data using literal references or a history reference from a compressed data stream, the system comprising:

pipeline control logic for receiving literal reference data and history reference data, and converting the history reference data to a plurality of corresponding addresses;

at least two history reference buffers in communication with the pipeline control logic, the history reference buffers being selectively accessed substantially simultaneously to retrieve previously stored uncompressed data associated with the corresponding addresses of the history reference data; and a plurality of output registers each in communication with a corresponding history reference buffer for substantially simultaneously receiving uncompressed data and providing the uncompressed data to an output channel.

12. The system of claim 11 wherein the history reference buffers comprise dual port synchronous static random access memories.

13. The system of claim 11 further comprising control logic for substantially simultaneously writing the at least two bytes of uncompressed data into each of the history reference buffers so that all history reference buffers contain identical data.

14. The system of claim 11 further comprising control logic for selectively providing data from an output of at least one of the plurality of output registers to an input of the at least one output register when an address generated by the history reference data corresponds to the address selected for writing the uncompressed data.

15. The system of claim 11 further comprising:

at least one combination buffer disposed between the pipeline control logic and the at least two history reference buffers for selectively buffering literal reference data or an address generated from history reference data in a delay stage;

at least one literal data buffer disposed in parallel with the history reference buffers for selectively buffering literal reference data;

wherein the pipeline control logic selectively bypasses the delay stage by advancing literal reference data directly to the literal data buffer and selectively advancing addresses generated from history reference data directly to the history reference buffers to assist in keeping all stages full of data.

16. A system for decompressing data read from a storage medium, the data represented as a series of literal references and history references, the history references being encoded in varying lengths and referring to previous data within a data stream, the system comprising:

a multiple stage pipeline process for substantially simultaneously processing at least two bytes of data in parallel, the pipeline process including:

a first stage for receiving literal and history references and converting the history references to a plurality of corresponding addresses, the first stage including pipeline control logic for directing data to subsequent stages;

a second stage in communication with the first stage and having parallel buffers corresponding in number to the at least two bytes of data for selectively storing data and or addresses provided from the first stage based on the pipeline control logic;

a third stage in communication with the first and second stages, the third stage having parallel literal buffers and parallel history buffers corresponding in number to the at least two bytes of data for selectively storing literal references and a predetermined number of bytes of previously processed uncompressed data, respectively; and a fourth stage in communication with the third stage, the fourth stage having parallel output buffers for storing uncompressed data and providing the uncompressed data to an output channel.

17. The system of claim 16 wherein the fourth stage includes control logic for selectively receiving data from an output of the output buffers rather than from the third stage when a history buffer location that would otherwise be accessed based on an address generated from a history reference is being updated.

18. The system of claim 16 wherein the pipeline control logic selectively advances data directly from the first stage to the third stage in an attempt to keep the third and fourth stages full of data while filling the second stage with any available addresses.

19. The system of claim 16 further comprising control logic for writing data passing from the third stage to the fourth stage into each of the history buffers.

* * * * *